(12) United States Patent
Iino et al.

(10) Patent No.: US 7,642,697 B2
(45) Date of Patent: Jan. 5, 2010

(54) ULTRASONIC MOTOR AND ELECTRONIC DEVICE USING THE SAME

(75) Inventors: Akihiro Iino, Chiba (JP); Satoshi Watanabe, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 12/077,660

(22) Filed: Mar. 20, 2008

(65) Prior Publication Data

US 2008/0246371 A1  Oct. 9, 2008

(30) Foreign Application Priority Data

Mar. 23, 2007 (JP) ............... 2007-075732
Mar. 13, 2008 (JP) ............... 2008-063708

(51) Int. Cl.
*H01L 41/08* (2006.01)
(52) U.S. Cl. .................... 310/323.02; 310/359
(58) Field of Classification Search ............ 310/323.02, 310/328, 359, 366
See application file for complete search history.

(56) References Cited

U.S. PATENT DOCUMENTS

| | | | | | |
|---|---|---|---|---|---|
| 4,678,956 | A | * | 7/1987 | Izukawa et al. | 310/323.06 |
| 5,719,462 | A | * | 2/1998 | Takagi | 310/323.03 |
| 6,064,140 | A | * | 5/2000 | Zumeris | 310/323.02 |
| 7,157,834 | B2 | * | 1/2007 | Miyazawa | 310/328 |
| 7,215,062 | B1 | * | 5/2007 | Iino et al. | 310/323.02 |

FOREIGN PATENT DOCUMENTS

JP  07184382  7/1995

* cited by examiner

*Primary Examiner*—Mark Budd
(74) *Attorney, Agent, or Firm*—Adams & Wilks

(57) ABSTRACT

Disclosed is an ultrasonic motor whose output is improved by enhancing the exciting force of a vibration caused on a vibrating body having a rectangular portion. The ultrasonic motor includes the vibrating body having a piezoelectric element, and a moving body which contacts the vibrating body. The phases of two difference vibrations caused on the vibrating body are changed to make the moving direction of the moving body or the vibrating body itself variable by selecting whether to apply a drive signal to first electrodes provided at one side of the piezoelectric element or to apply a drive signal to second electrodes provided at a portion whose polarization direction differs from that of the first electrodes.

12 Claims, 17 Drawing Sheets

ULTRASONIC MOTOR AND ELECTRONIC DEVICE USING THE SAME

BACKGROUND OF THE INVENTION

1. Field of the Invention

The present invention relates to an ultrasonic motor which frictionally drives a moving body with the vibration of a vibrating body, and an electronic device using the same, and, particularly, to an ultrasonic motor which drives a moving body with a vibration obtained by combining a longitudinal vibration and a bending vibration caused on a rectangular vibrating body.

2. Description of the Related Art

Recently, with size reduction, functional enhancement and reduction in consumed power of electronic devices, attention has been paid to ultrasonic motors as an actuator to move operational parts, and achievement of the adoption thereof is increasing. Particularly, many linear type ultrasonic motors which can be driven directly are used in electronic devices, such as a precision stage, which need high-accuracy positioning. There is known a typical linear type ultrasonic motor which utilizes a combined vibration of the longitudinal vibration and bending vibration of a rectangular vibrating body. This ultrasonic motor has four electrodes provided at one side of a piezoelectric element to be a vibrating body, which has a rectangular plate shape, and grouped into two sets of electrodes each having two orthogonal electrodes, and a drive signal is applied to one of the two sets of electrodes to provide a vibration necessary to drive the vibrating body (see JP-A-7-184382). The moving direction of the moving body is determined by selecting electrodes to which the drive signal is to be applied. This ultrasonic motor therefore is characterized by simplification of the drive circuit due to a single drive signal used.

However, the ultrasonic motor using the vibration of a rectangular plate is disadvantageous in that the exciting force of the vibration (particularly, bending vibration) caused on the rectangular plate to be the vibrating body is weak, so that the ultrasonic motor has a smaller output and lower efficiency.

SUMMARY OF THE INVENTION

Accordingly, it is an object of the present invention to provide an ultrasonic motor whose output is improved by enhancing the exciting force of a vibration caused on a vibrating body having a rectangular portion.

To achieve the object, according to one aspect of the invention, there is provided an ultrasonic motor including a vibrating body having a piezoelectric element; a moving body which contacts the vibrating body; a first electrode or first electrodes provided at one side of the piezoelectric element, whereby the moving body or the vibrating body itself is driven in a first direction by a vibration caused on the vibrating body by applying a drive signal between the first electrode or first electrodes and a GND electrode provided at an other side of the piezoelectric element; and a second electrode or second electrodes provided at the one side of the piezoelectric element, whereby the moving body or the vibrating body itself is driven in a second direction by a vibration caused on the vibrating body by applying a drive signal between the second electrode or second electrodes and the GND electrode provided at the other side of the piezoelectric element, wherein a polarization direction of a portion of the piezoelectric element where the first electrode or the first electrodes are provided differs from a polarization direction of a portion of the piezoelectric element where the second electrode or the second electrodes are provided.

With the configuration, the vibration caused on the vibrating body can be enhanced to increase the drive force of the moving body, thereby improving the output of the ultrasonic motor.

Because the exciting force of the vibration (particularly, bending vibration) caused on the vibrating body can be increased according to the present invention, the acquired output of the moving body becomes greater, thus making the efficiency of the ultrasonic motor higher. This makes it possible to achieve size reduction and reduction in consumed power of an electronic device having the ultrasonic motor of the present invention mounted therein.

DETAILED DESCRIPTION OF THE PREFERRED EMBODIMENTS

Figure 1:
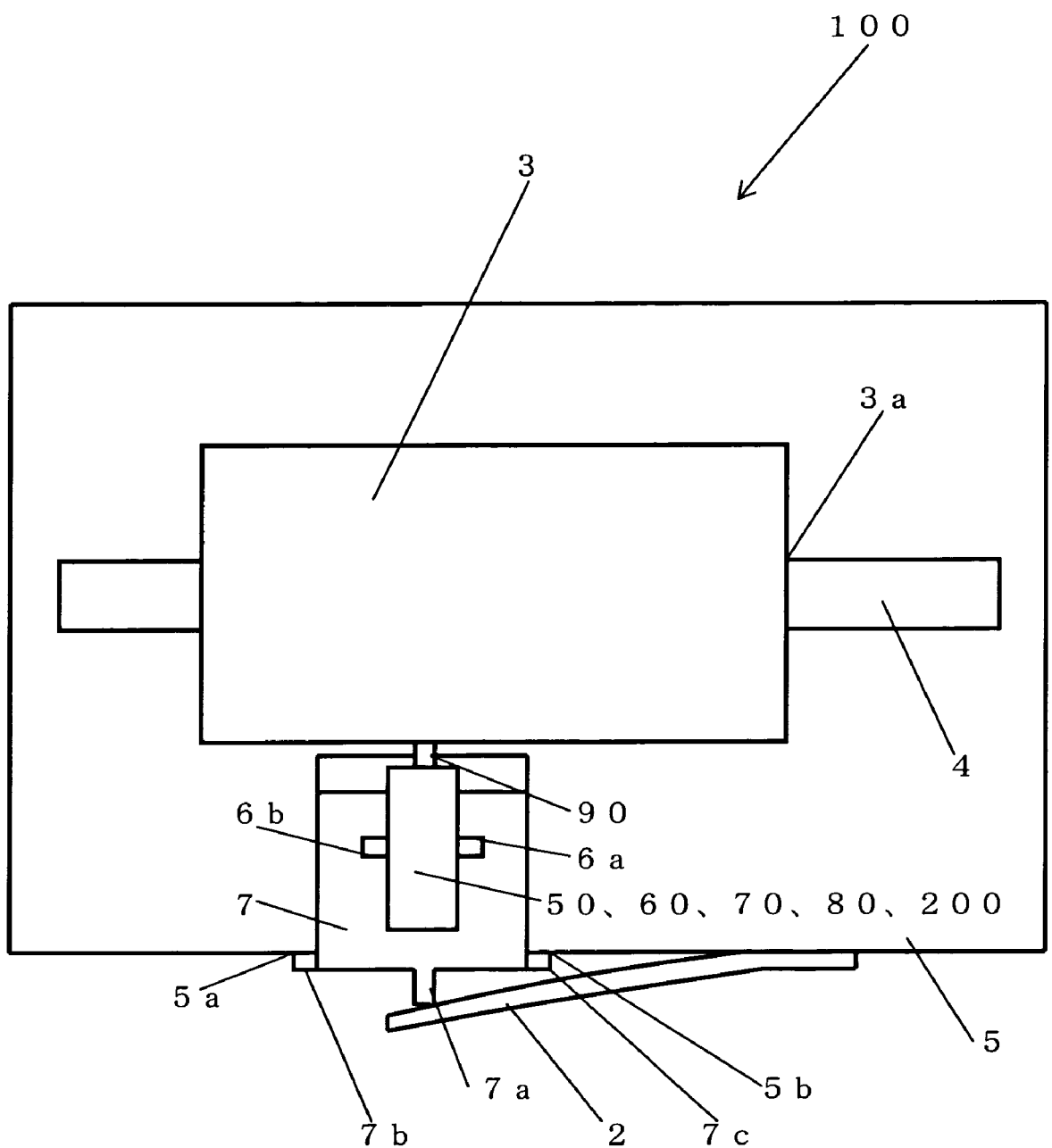
FIG. 1 is a diagram showing the configuration of an ultrasonic motor of the present invention.

Preferred embodiments of the present invention will be described below with reference to the accompanying drawings.

First Embodiment

An ultrasonic motor according to a first embodiment of the present invention and an electronic device using the same will be described referring to the diagrams. To begin with, the configuration of an ultrasonic motor 100 of the invention using the ultrasonic motor 100 as a stage (electronic device) 100 will be described by way of example referring to FIG. 1.

The ultrasonic motor 100 of the invention generally includes a vibrating body 50 comprised of a rectangular piezoelectric element 1, a moving body 3 which is in contact with and is frictionally driven by the vibrating body 50, and a pressurizing member 2 which generates a contact pressure between the vibrating body 50 and the moving body 3.

A rail 4 provided on a plate-like fixed member 5 is engaged with a guide groove 3a provided along the moving direction of the moving body 3, so that the moving body 3 is guided so as to be movable in the lengthwise direction of the rail 4. Although the guide structure provided by the rail 4 and the guide groove 3a is illustrated, a linear guide commercially available on the market and using rolling of a ball may be used. A center portion of the vibrating body 50 (positioned at the node of a vibration to be discussed later) in the lengthwise direction thereof is fixed by support members 6a, 6b provided protruding from a support plate 7. The support plate 7 and the vibrating body 50 are guided so as to be movable in the direction of the moving body 3 by engagement of projections 7b, 7c protruding from a side face of the support plate 7 with guide grooves 5a, 5b provided at the fixed member 5. A friction member 90 of ceramics (alumina or the like) with excellent wear resistance is connected to a lengthwise distal end of the vibrating body 50. The pressure of the leaf spring (pressurizing member) 2 having one end fixed to the fixed member 5 is applied to a projection 7a provided at the support plate 7 to force the friction member 90 provided at the vibrating body 50 to contact the moving body 3 with pressure. A drive signal is applied to the vibrating body 50 from a drive circuit (not shown), so that the vibrating body 50 simultaneously generates two different vibrations. The combined vibration of the two different vibrations causes the friction member 90 to take a motion (basically, elliptical motion) having a displacement component in the moving direction of the moving body 3 and a displacement component in the direction of contact between the vibrating body 50 and the moving body 3, allowing the moving body 3 to move. In FIG. 1, the moving body 3 is a table on which a sample, a workpiece to be worked or the like can be mounted, and the ultrasonic motor 100 itself serves as the stage 100.

Figure 2A:
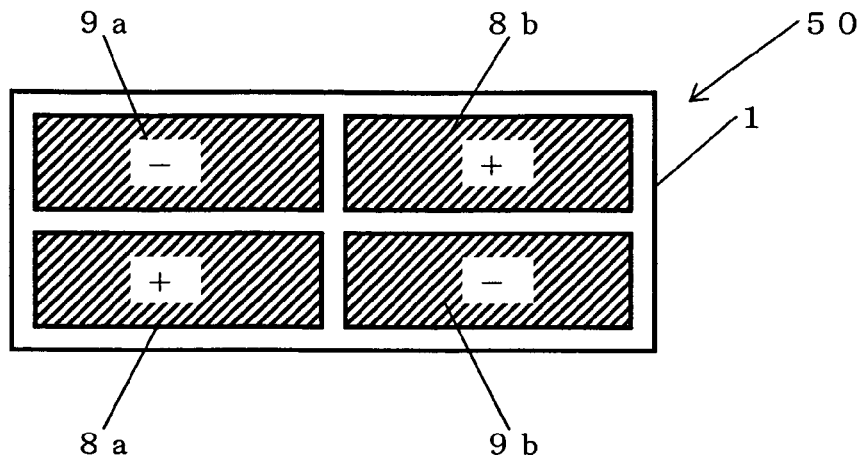
FIGS. 2A and 2B are diagrams showing the electrode structure of a vibrating body according to a first embodiment of the invention.
Figure 2B:
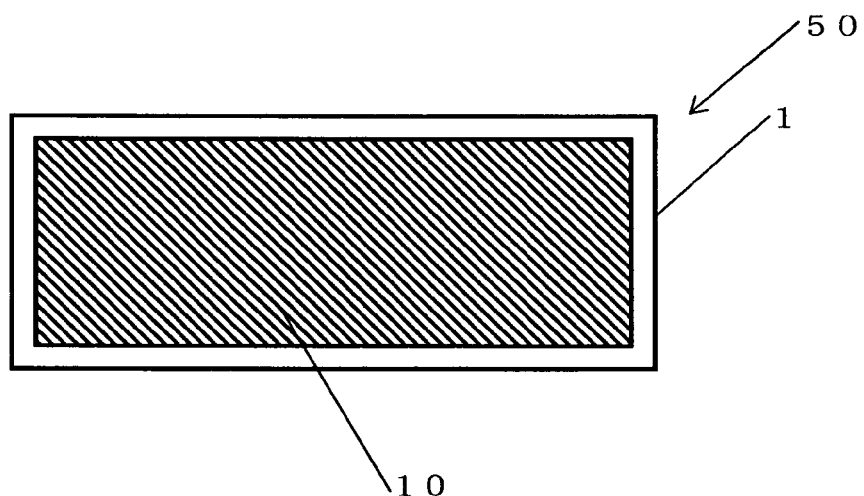
Figure 2C:
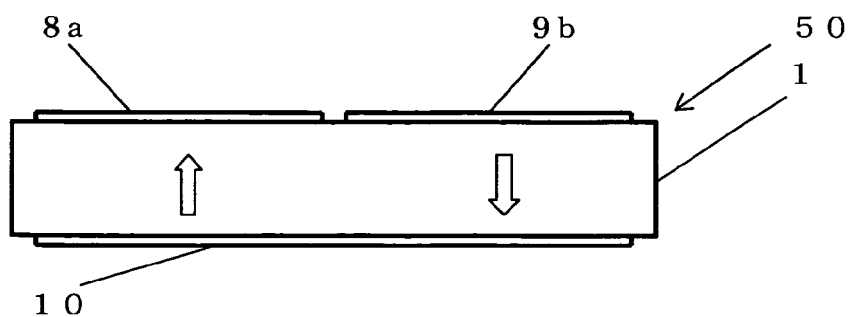
FIG. 2C is a side view of the vibrating body shown in FIG. 2A showing the polarization directions.

Next, the structure of the vibrating body 50 which characterizes the ultrasonic motor 100 of the invention will be described in detail referring to FIGS. 2A-2C. As a matter of convenience for the explanation, the description of the friction member 90 is omitted hereunder. The vibrating body 50 is comprised of the rectangular piezoelectric element 1. As shown in FIG. 2A, electrode 8a, 8b, 9a, 9b of silver or the like are provided at the top surface (one side) of the piezoelectric element 1 in four areas separated by a line connecting the center portions of two widthwise sides (short sides provided in the moving direction of the moving body 3) and a line connecting the center portions of two lengthwise sides (long sides provided in the direction of contact of the vibrating body 50 and the moving body 3). Then, an electrode 10 is provided substantially over the entire bottom side (the other side) of the piezoelectric element 1. With the electrode 10 serving as the GND, a high voltage is applied to the electrodes 8a, 8b, 9a, 9b, so that the piezoelectric element 1 is polarized in directions of + and − in FIG. 2A. In FIG. 2C, which is a side view of the vibrating body 50 shown in FIG. 2A, the polarization directions are shown by solid arrows. Of the electrodes, two orthogonal electrodes 8a, 8b constitute first electrodes 8, and the other two orthogonal electrodes 9a, 9b constitute second electrodes 9.

Figure 3A:
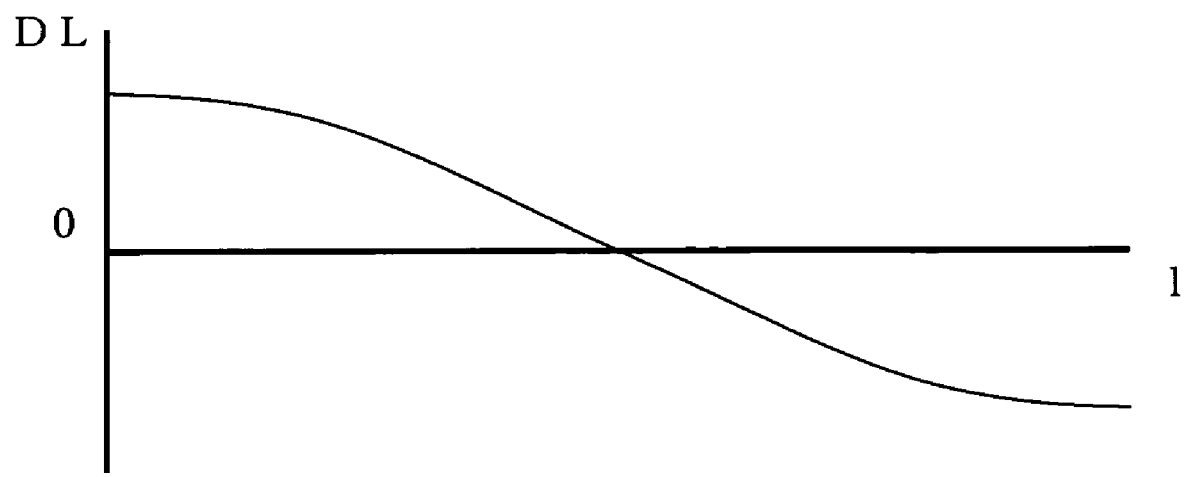
FIGS. 3A and 3B are diagrams showing the vibration modes of the vibrating body according to the first embodiment of the invention.
Figure 3B:
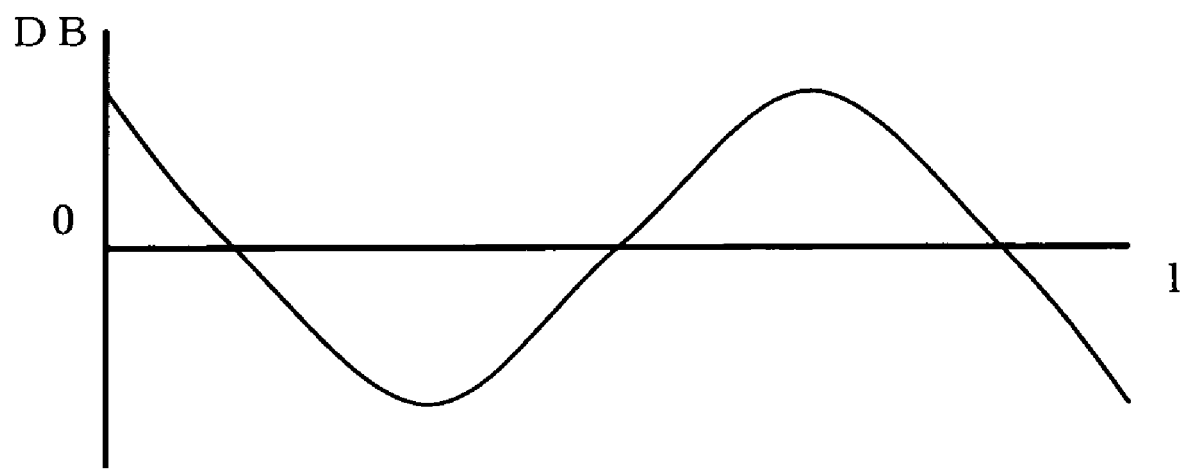

The lengthwise length and the widthwise length of the vibrating body 50 are set in such a way that the natural frequency of the longitudinal vibration and the natural frequency of the bending vibration are close to or match with each other, both these vibrations being caused on the vibrating body 50. The longitudinal vibration and bending vibration are vibrations which cause displacements in a plane including the lengthwise direction and the widthwise direction. FIGS. 3A and 3B show displacement distributions of the lengthwise vibration of the vibrating body 50, namely the amplitude distribution (DL) of the longitudinal vibration and the amplitude distribution (DB) of the bending vibration in the lengthwise direction of the vibrating body 50, respectively.

Next, a drive method for the ultrasonic motor 100 will be described. When the drive signal is applied between the first electrodes 8 provided at the vibrating body 50 and the GND electrode 10, the vibrating body 50 is excited to have a longitudinal vibration and bending vibration. The combined vibration of those two vibrations causes the moving body 3 to be driven frictionally. When the drive signal is applied between the second electrodes 9 provided at the vibrating body 50 and the GND electrode 10, the phase relationship between the longitudinal vibration and bending vibration caused by the vibrating body 50 is reversed. Therefore, the direction of the elliptical motion of the friction member 90 caused by the combined vibration of the two vibrations is reversed, thus reversing the moving direction of the moving body 3.

While the vibrating body 50 is fixed and the moving body 3 is moved in the foregoing example, the vibrating body 50 can be driven itself by fixing the moving body 3 and setting the vibrating body 50 operable.

Figure 4A:
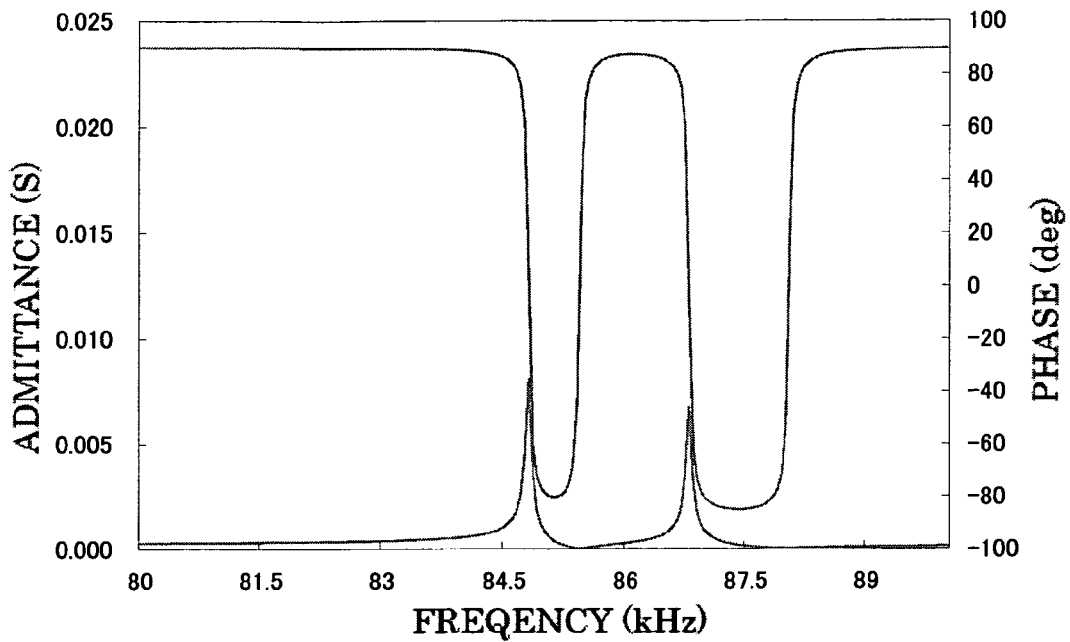
FIGS. 4A and 4B are diagrams showing the relationship between the frequency-admittance and phase of the vibrating body according to the first embodiment of the invention.
Figure 4B:
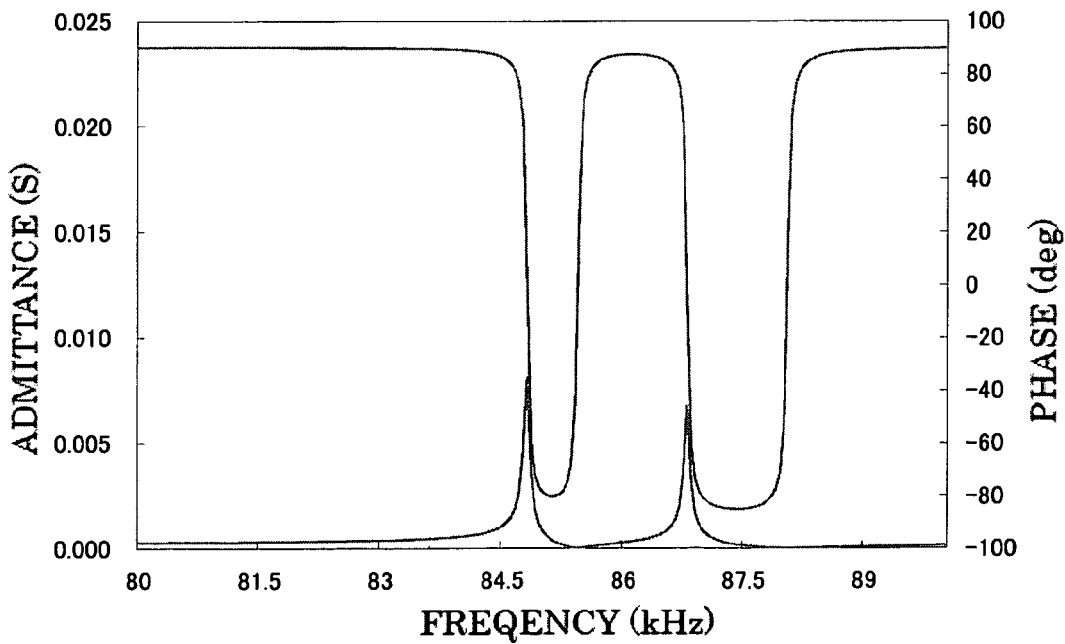
Figure 5:
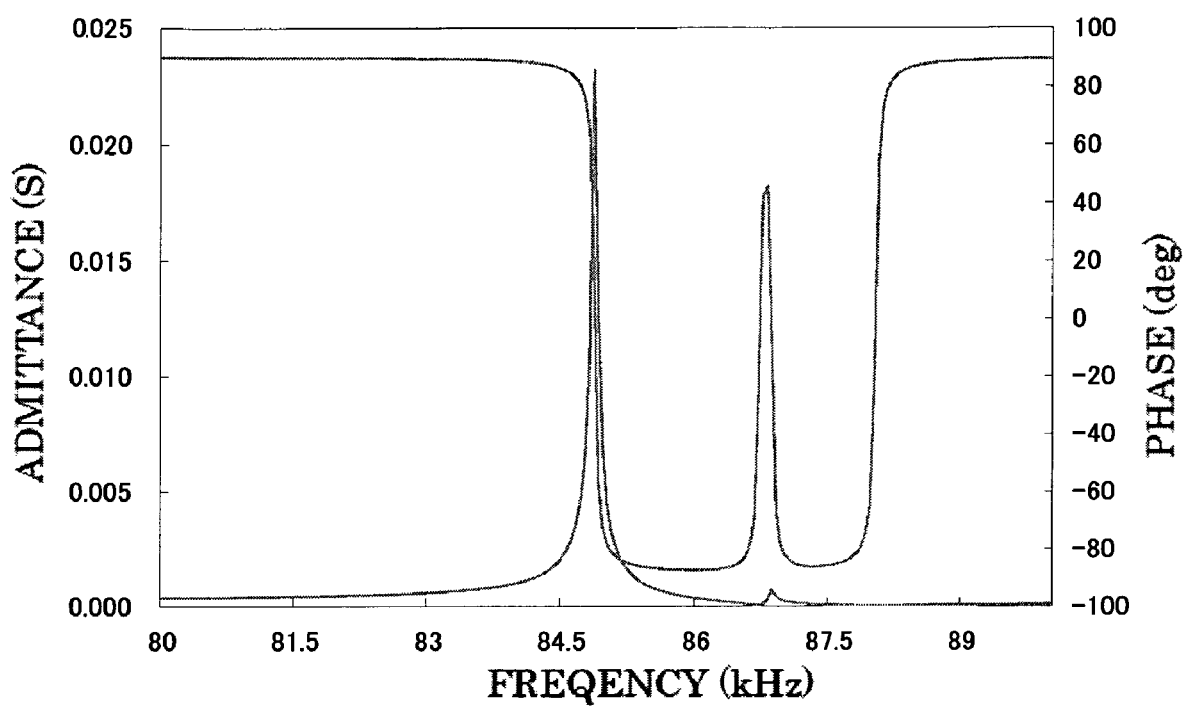
FIG. 5 is a diagram showing the relationship between the frequency-admittance and phase of the vibrating body to be compared with the first embodiment of the invention.

Changing the polarization direction for each group of electrodes makes the exciting force of, particularly, the bending vibration (which contributes to feeding of the moving body 3), so that the output efficiency of the ultrasonic motor 100 is improved considerably. This will be explained below specifically. FIG. 4A shows the relationship between the frequency-admittance and phase when the drive signal is applied between the first electrodes 8 and the GND electrode 10, and FIG. 4B shows the relationship between the frequency-admittance and phase when the drive signal is applied between the second electrodes 9 and the GND electrode 10. As a comparative example, the relationship between the frequency-admittance and phase when the drive signal is applied between the first electrodes 8 and the GND electrode 10 with all the areas indicated by the electrodes 8a, 8b, 9a, 9b of the vibrating body 1 being polarized in the same direction (+) is shown in FIG. 5.

Those are the examples where by using a finite element method (used software: Piezo Plus (produced by Dynus Co., Ltd.), analysts was conducted on a model with the vibrating body 50 (piezoelectric element 1) having a long side of 19 mm, a short side of 5.3 mm and a thickness of 2.0 mm, the individual electrodes having a width of 2.2 mm, and the individual electrodes having a marginal width of 0.3 mm, and a gap of 0.3 mm between the electrodes and the side face.

In any of the diagrams, the peak of the low-order admittance corresponds to the resonance point of the longitudinal vibration of the vibrating body 1, while the peak of the high-order resonance corresponds to the resonance point of the bending vibration.

The exciting force of the bending vibration is increased by changing the polarization directions of the two groups of electrodes this way (which contributes to feeding of the moving body 3). This is because as the polarization directions of those portions of the piezoelectric element 1 where the two groups of electrodes are provided differ from each other, the influence of the counterelectric field generated at the electrode to which the drive signal is not applied at the time of driving the vibrating body 50 on the excitation of the vibration differs.

Although the GND electrode 10 is provided over the entire bottom side of the piezoelectric element 1 in the embodiment, the electrodes (a plurality of GND electrodes 10 may be provided) may be provided only at those portions which face the electrodes 8a, 8b, 9a, 9b. In this case, of the electrodes 8a, 8b, 9a, 9b, the drive signal is applied between those electrodes to which the drive signal is to be applied and the opposing GND electrodes 10 to drive the vibrating body 50.

Second Embodiment

Figure 6A:
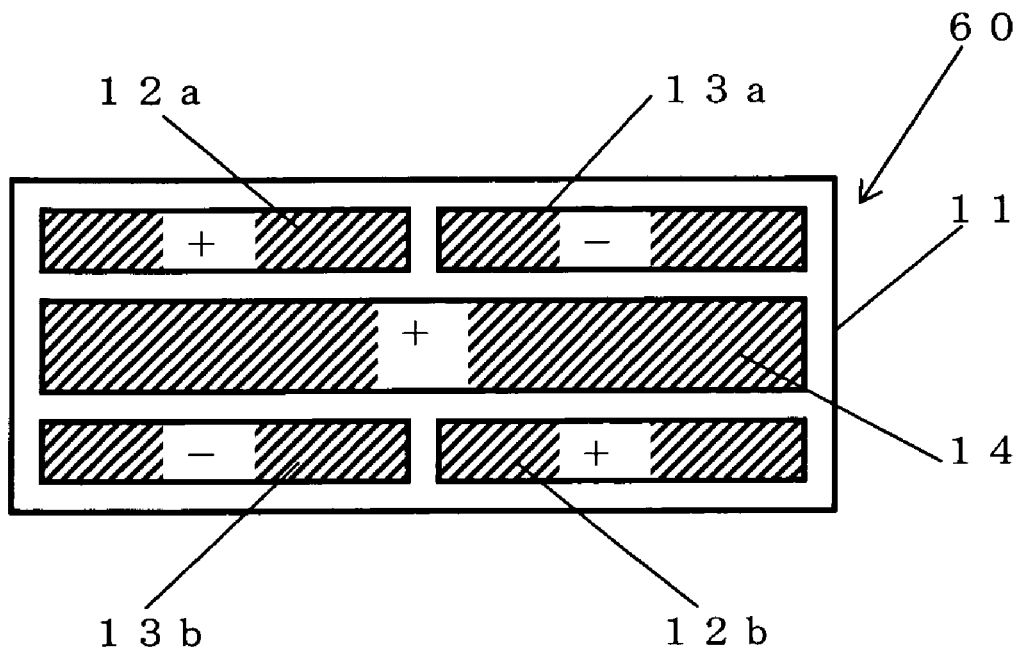
FIGS. 6A and 6B are diagrams showing the electrode structure of a vibrating body according to a second embodiment of the invention.
Figure 6B:
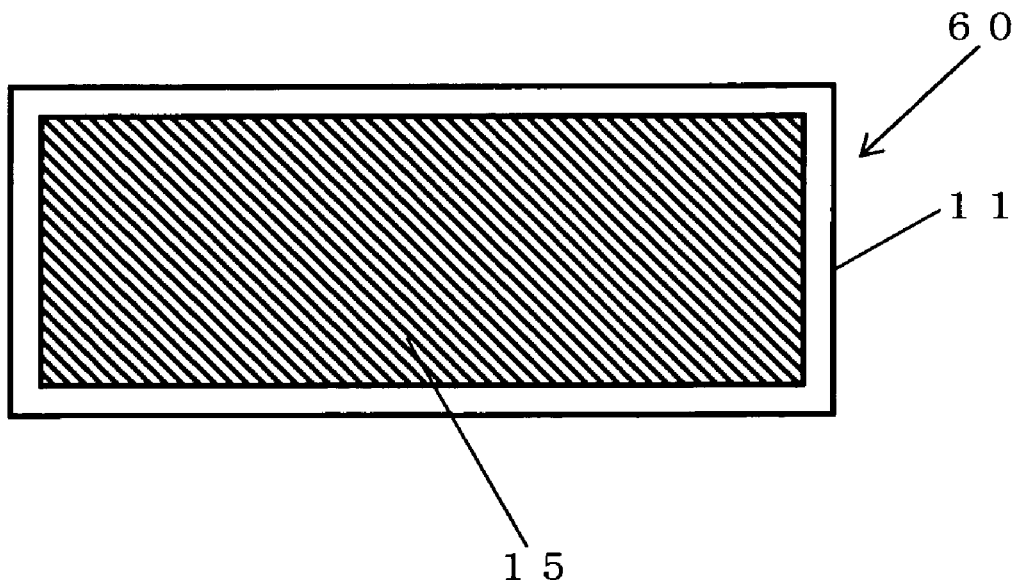

A second embodiment of an ultrasonic motor of the present invention will be described below referring to FIGS. 6A and 6B. The following description is centered on differences from the illustrated vibrating body 50 of the first embodiment or the electrode structure of the vibrating body 60. An electrode (third electrode) 14 is provided at the top surface (one side) of a piezoelectric element 11 at a portion located at the center portion of three areas separated by lines connecting points which separates two short sides of the rectangular portion into three portions, electrodes 12a, 12b, 13a, 13b are provided at four areas obtained by further separating two end portions of the three areas by a line connecting center points of two long sides of the piezoelectric element 11, two electrodes 12a, 12b provided at two orthogonal portions of the four areas constitute first electrodes 12, and two electrodes 13a, 13b provided at other two orthogonal portions of the four areas constitute second electrodes 13. Then, an electrode 15 is provided substantially over the entire bottom side (the other side) of the piezoelectric element 11. With the electrode 15 serving as the GND, a DC voltage is applied to the electrodes 12a, 12b, 13a, 13b, 14 so that the piezoelectric element 11 is polarized in directions of + and − in FIG. 6A.

Next, a drive method for the vibrating body 60 will be described. When the drive signal is applied between the GND electrode 15 and the first electrodes 12 and the third electrode 14, the moving body 3 is driven with the longitudinal vibration and bending vibration simultaneously excited as per the first embodiment. When the drive signal is applied between the GND electrode 15 and the second electrodes 13 and the third electrode 14, by way of contrast, the phase relationship between the longitudinal vibration and bending vibration is reversed, so that the moving body 3 is driven in the opposite direction.

Figure 7A:
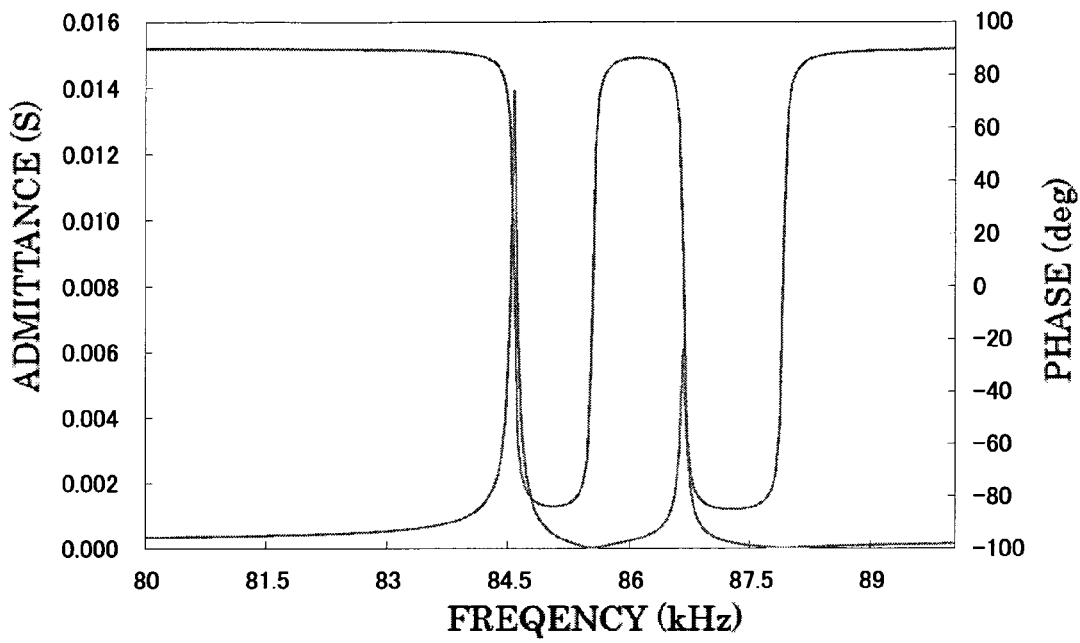
FIGS. 7A and 7B are diagrams showing the relationship between the frequency-admittance and phase of the vibrating body according to the second embodiment of the invention.
Figure 7B:
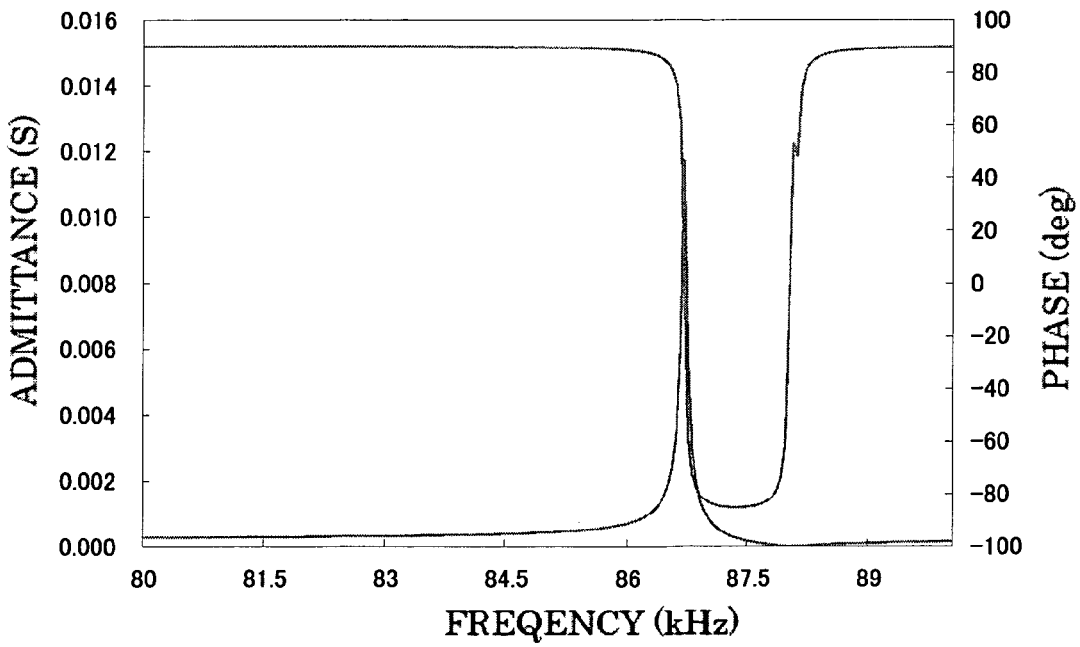
Figure 8:
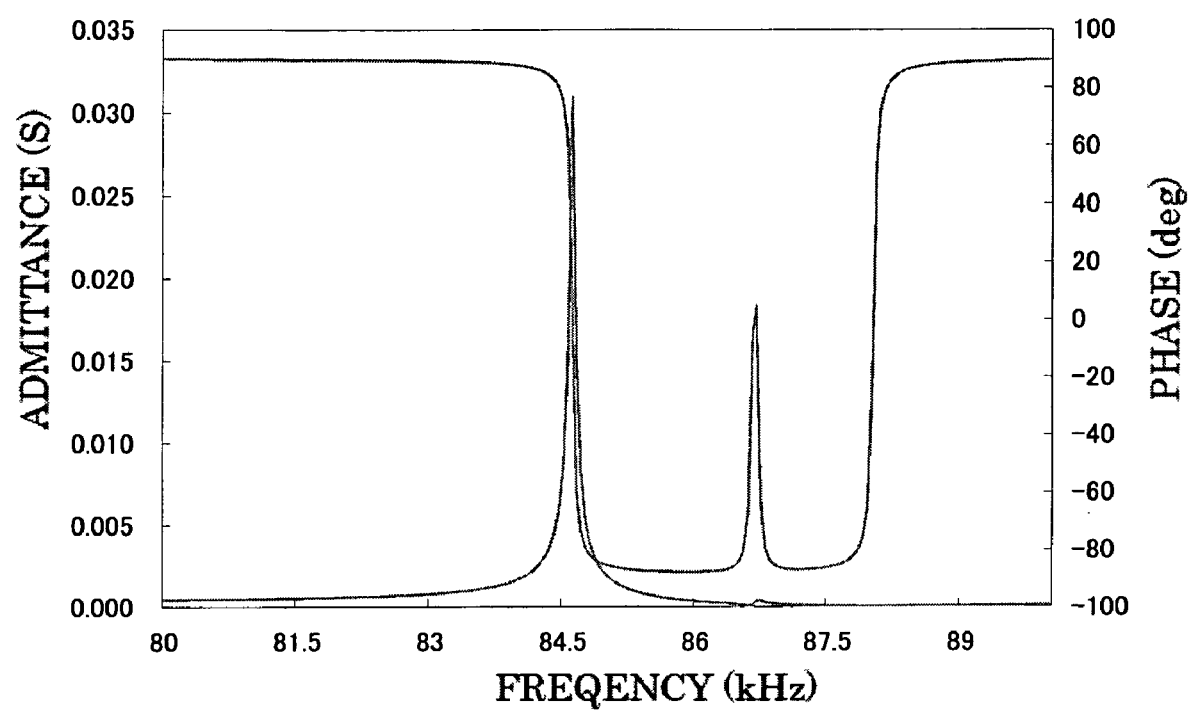
FIG. 8 is a diagram showing the relationship between the frequency-admittance and phase of the vibrating body to be compared with the second embodiment of the invention.

It is better that the drive signal should substantially be applied between the GND electrode 15 and the first electrodes 12 and the third electrode 14 which have the same polarization directions. The reason will be given below. FIG. 7A shows the relationship between the frequency-admittance and phase when the drive signal is applied between the GND electrode 15 and the first electrodes 12 and the third electrode 14, and FIG. 7B shows the relationship between the frequency-admittance and phase when the drive signal is applied between the GND electrode 15 and the second electrodes 13 and the third electrode 14. As a comparative example, the relationship between the frequency-admittance and phase when the drive signal is applied between the GND electrode 15 and the first electrodes 12 and the third electrode 14 with the polarization directions of the vibrating body 60 shown in FIGS. 6A and 6B all being identical (the polarization direction of the area where the second electrodes 13 are positioned is also +) is shown in FIG. 8.

Those are the examples where by using a finite element method (used software: Piezo Plus (produced by Dynus Co., Ltd.), analysts was conducted on a model with the vibrating body 60 having a long side of 19 mm, a short side of 5.3 mm and a thickness of 2.0 mm, the electrodes constituting the first electrode and the second electrodes having a width of 1.4 mm, the third electrode having a width of 1.3 mm, and the individual electrodes having a marginal width of 0.3 mm, and a gap of 0.3 mm between the electrodes and the side face.

In any of the diagrams, the peak of the low-order admittance corresponds to the resonance point of the longitudinal vibration of the vibrating body 60, while the peak of the high-order resonance corresponds to the resonance point of the bending vibration. (Although the peak of the high-order resonance in FIG. 7B is small and difficult to discriminate, it exists at a frequency at which the phase is disturbed).

According to the vibrating body 60, if the drive signal is applied between the GND electrode 15 and the first electrodes 12 and the third electrode 14, the bending vibration is excited greater so that the output of the moving body 3 becomes larger as compared with a case where the drive signal is applied between the GND electrode 15 and the second electrodes 13 and third electrode 14, and further with the comparative example.

Third Embodiment

Figure 9A:
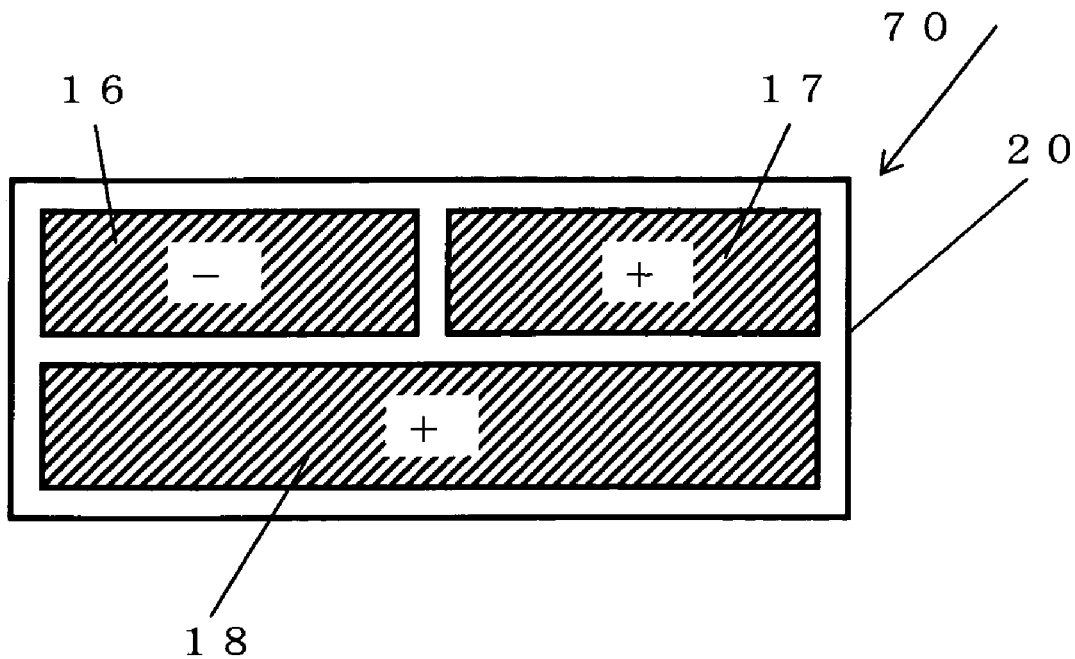
FIGS. 9A and 9B are diagrams showing the electrode structure of a vibrating body according to a third embodiment of the invention.
Figure 9B:
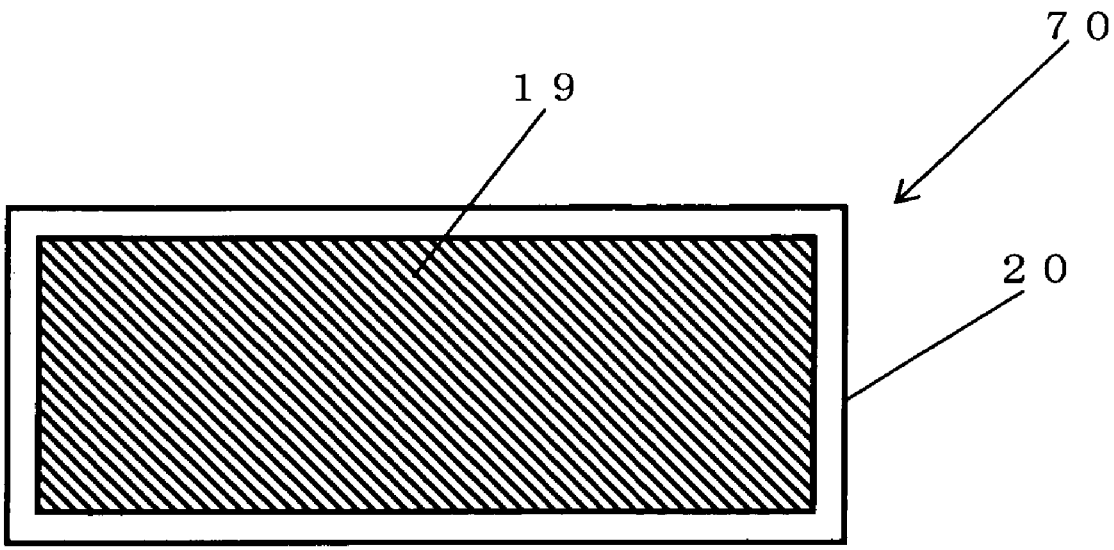

A third embodiment of an ultrasonic motor of the present invention will be described below referring to FIGS. 9A and 9B. The following description is centered on differences from the illustrated vibrating bodies 50 and 60 of the first embodiment and the second embodiment, or the electrode structure of a vibrating body 70.

An electrode 18 is provided at the top surface (one side) of a piezoelectric element 20 at one of two areas separated by a line connecting points which separates two short sides of the piezoelectric element 20 into two portions, and an electrode 16 and an electrode 17 are provided at two areas obtained by further separating the other area by a line connecting center points of two long sides of the piezoelectric element 20. An electrode 19 is provided substantially over the entire bottom side (the other side) of the piezoelectric element 20. With the electrode 19 serving as the GND, a high voltage is applied to the electrodes 16, 17, 18, so that the piezoelectric element 20 is polarized in directions of + and − in FIG. 9A.

Next, a drive method for the vibrating body 70 will be described. When the drive signal is applied between the GND electrode 19 and the first electrode 16 and third electrode 18, the moving body 3 is driven with the longitudinal vibration and bending vibration simultaneously excited as per the first embodiment. When the drive signal is applied between the GND electrode 19 and the second electrode 17 and third electrode 18, by way of contrast, the phase relationship between the longitudinal vibration and bending vibration is reversed, so that the moving body 3 is driven in the opposite direction.

Figure 10A:
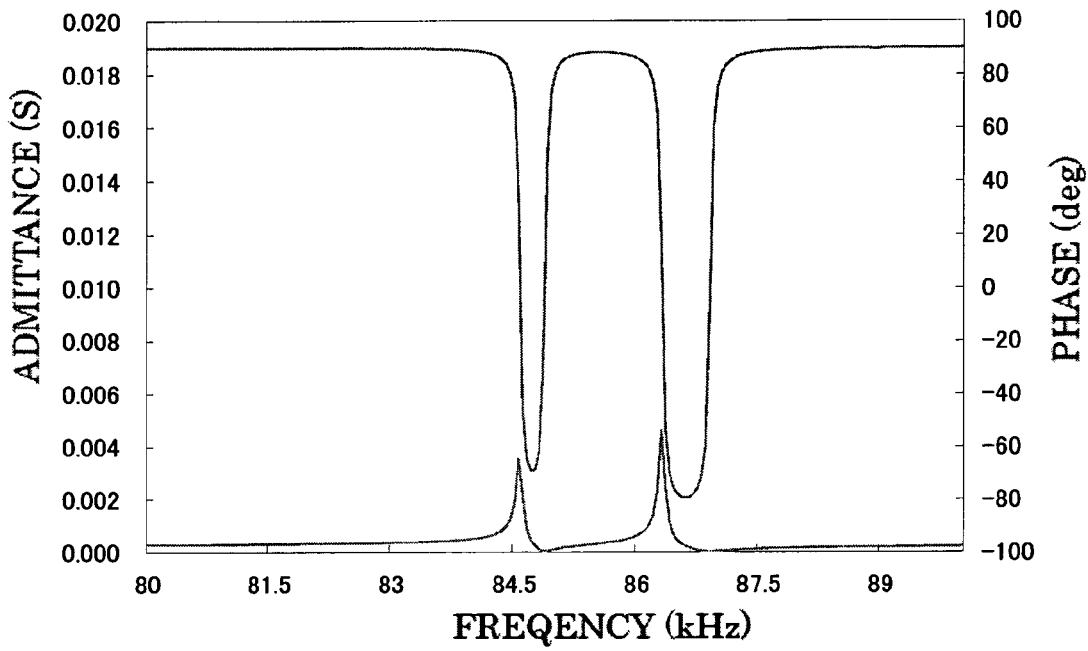
FIGS. 10A and 10B are diagrams showing the relationship between the frequency-admittance and phase of the vibrating body according to the third embodiment of the invention.
Figure 10B:
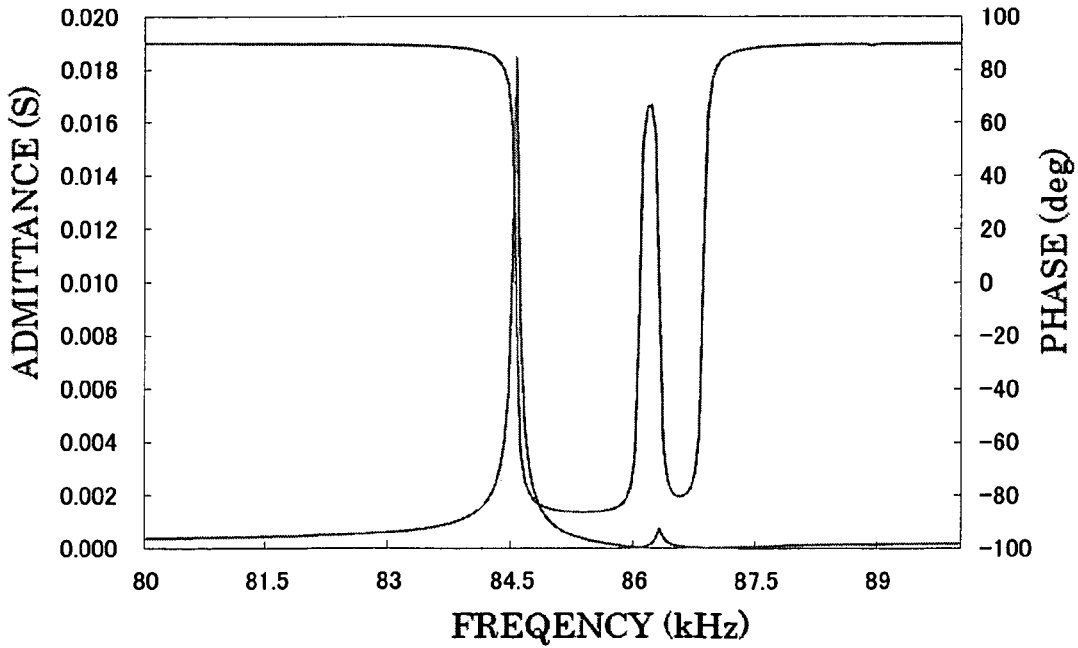
Figure 11:
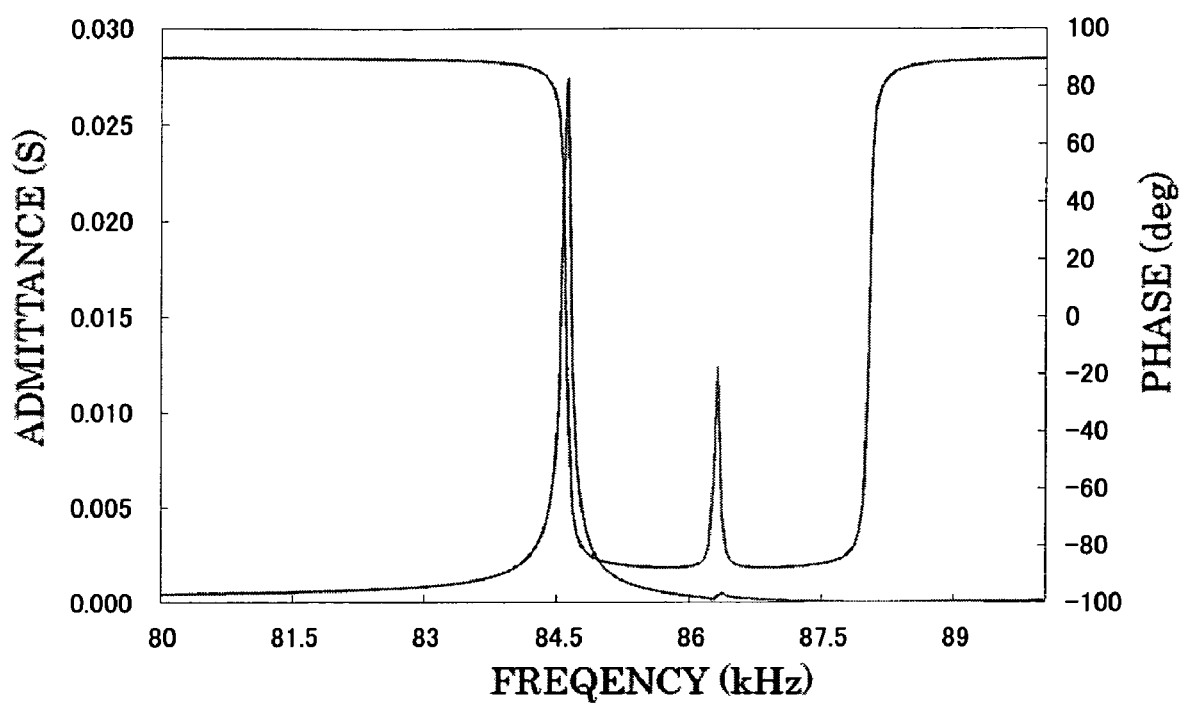
FIG. 11 is a diagram showing the relationship between the frequency-admittance and phase of the vibrating body to be compared with the third embodiment of the invention.

It is better that the drive signal should substantially be applied between the GND electrode 19 and the first electrode 16 and the third electrode 18. The reason will be given below. FIG. 10A shows the relationship between the frequency-admittance and phase when the drive signal is applied between the GND electrode 19 and the first electrode 16 and the third electrode 18, and FIG. 10B shows the relationship between the frequency-admittance and phase when the drive signal is applied between the GND electrode 19 and the second electrode 17 and the third electrode 18. As a comparative example, the relationship between the frequency-admittance and phase when the drive signal is applied between the GND electrode 19 and the first electrode 16 and the third electrode 18 with the polarization directions of the vibrating body 20 shown in FIGS. 9A and 9B all being identical (the polarization direction of the area where the first electrode 16 is positioned is also +) is shown in FIG. 11.

Those are the examples where by using a finite element method (used software: Piezo Plus (produced by Dynus Co., Ltd.), analysts was conducted on a model with the vibrating body 70 having a long side of 19 mm, a short side of 5.3 mm and a thickness of 2.0 mm, the individual electrodes having a width of 2.2 mm, and the individual electrodes having a marginal width of 0.3 mm, and a gap of 0.3 mm between the electrodes and the side face.

In any of the diagrams, the peak of the low-order admittance corresponds to the resonance point of the longitudinal vibration of the vibrating body 70, while the peak of the high-order resonance corresponds to the resonance point of the bending vibration.

According to the vibrating body 70, if the drive signal is applied between the GND electrode 19 and the first electrode 16 and the third electrode 18, the bending vibration is excited greater so that the output of the moving body 3 becomes larger as compared with a case where the drive signal is applied between the GND electrode 19 and the second electrode 17 and third electrode 18, and further with the comparative example.

Fourth Embodiment

A fourth embodiment of the present invention will be described below referring to FIGS. 12 and 13A to 13C. The following describes only differences from the illustrated vibrating body 50 of the first embodiment, or the electrode structure of a vibrating body 80. The description of the friction member 90 is omitted from the following description.

Figure 12:
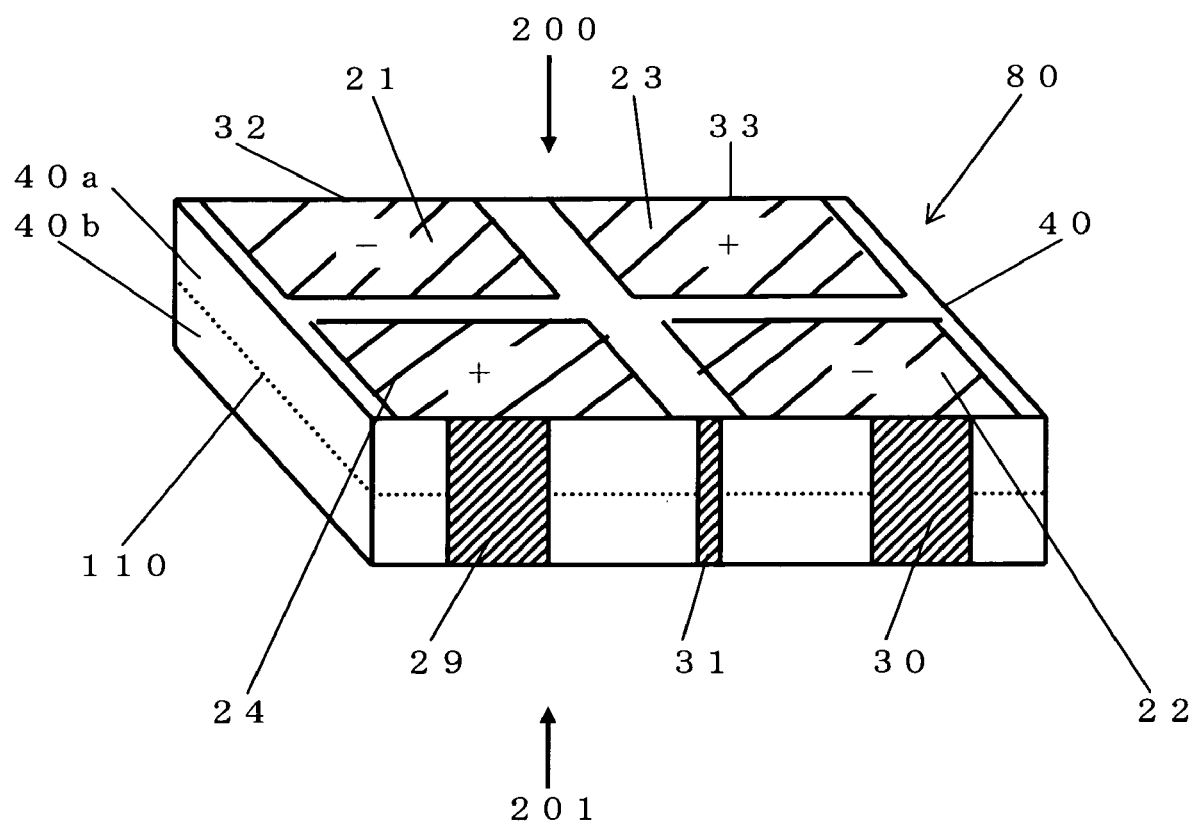
FIG. 12 is a perspective view of a vibrating body according to a fourth embodiment of the invention.

FIG. 12 is a perspective view of the vibrating body 80, and a broken line 110 in the diagram indicates a jointed surface of two piezoelectric elements 40a, 40b. The vibrating body 80 is one that the illustrated vibrating body 50 of the first embodiment is modified to have a laminated structure. The vibrating body 80 has the piezoelectric elements 40a, 40b overlaid and coupled integrally. Specifically, after the piezoelectric elements 40a, 40b in a green sheet state are laminated and pressurized, and baked into a piezoelectric element 40; the piezoelectric elements 40a, 40b may be coupled by an adhesive.

Figure 13A:
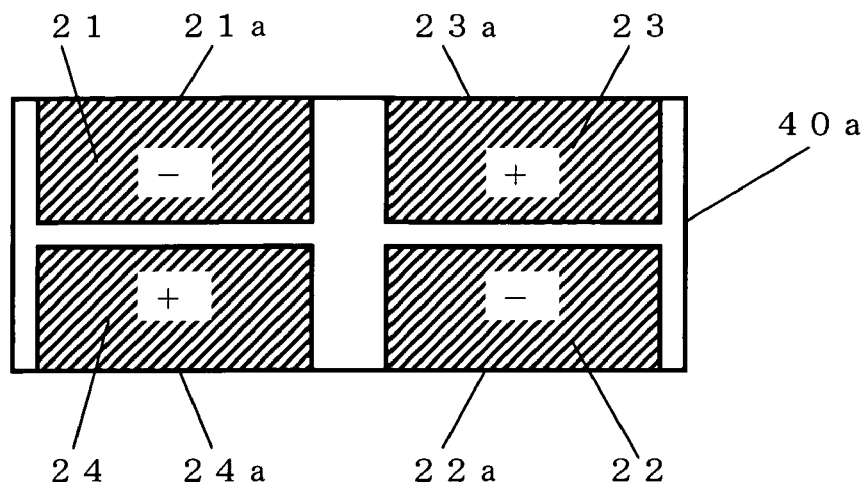
FIGS. 13A to 13C are diagrams showing the electrode structure of the vibrating body according to the fourth embodiment of the invention.
Figure 13B:
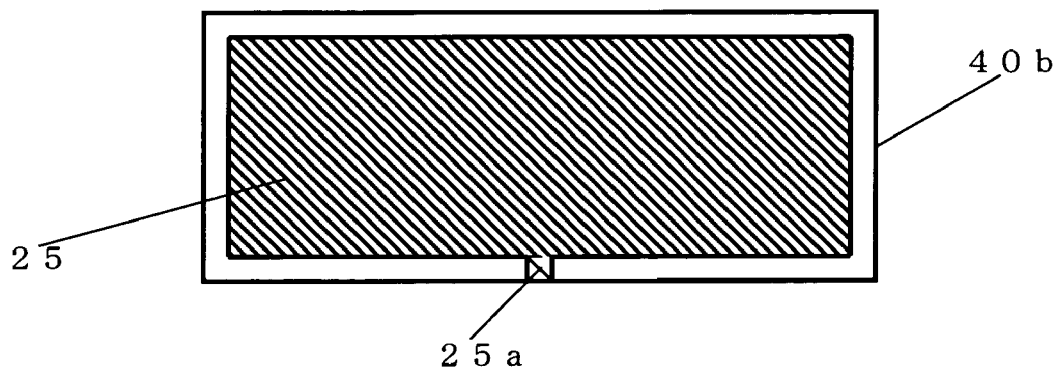
Figure 13C:
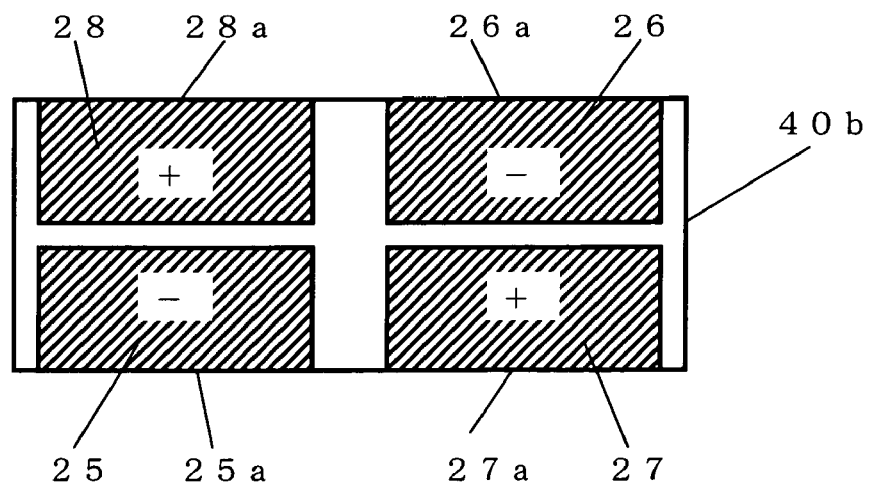
Figure 14:
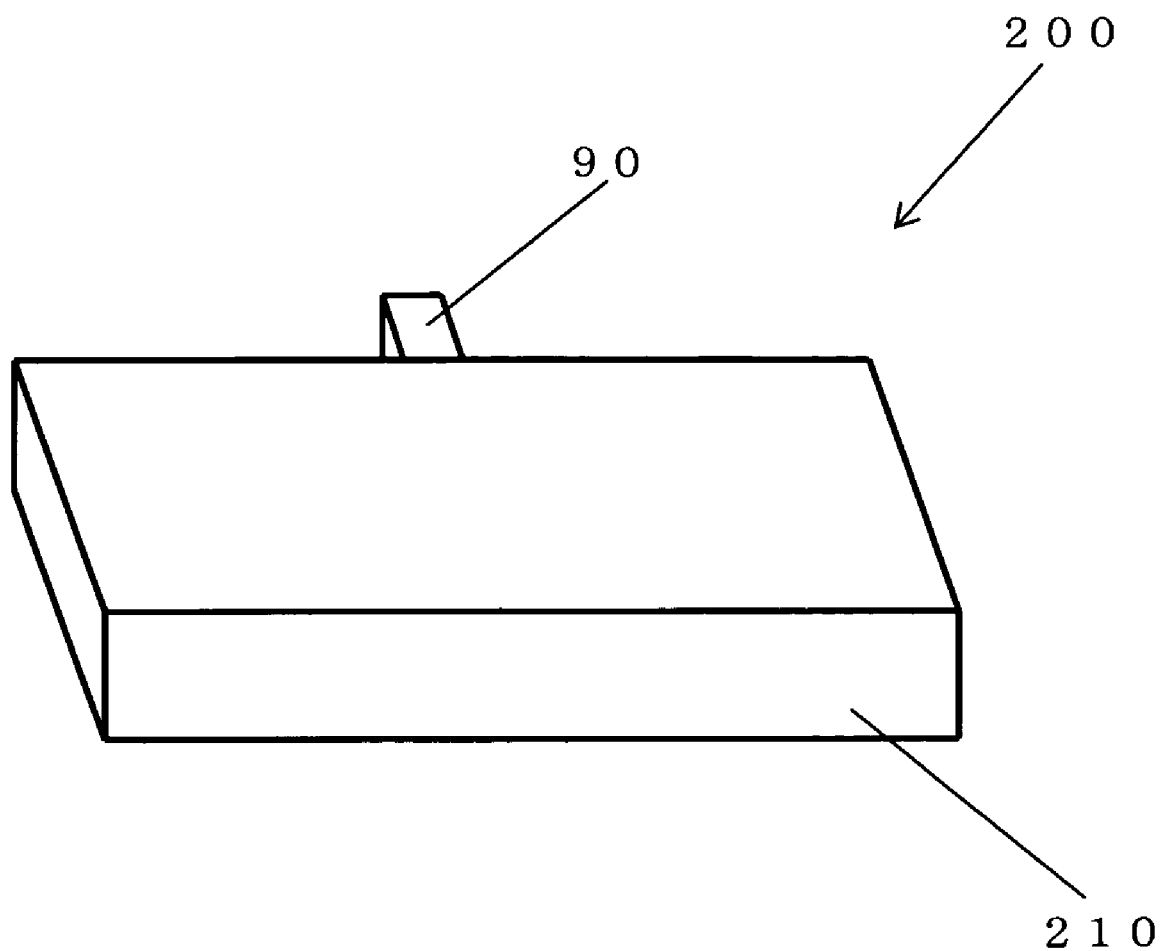
FIG. 14 is a perspective view of a vibrating body according to a fifth embodiment of the invention.

The electrode structure of the vibrating body 80 will be described next. FIG. 13A is a view from the top surface of the vibrating body 80 (direction of an arrow 200), FIG. 13B is a view of an electrode 25 at the boundary between the piezoelectric elements 40a, 40b (broken line 110) from the top surface of the piezoelectric element 40b, and FIG. 13C is a view of the vibrating body 80 (piezoelectric element 40b) from the bottom surface (arrow 201).

Electrodes 21, 22, 23, 24 of silver or the like are provided at the top surface of the vibrating body 80 in four areas separated by a line connecting the center portions of two widthwise sides (short sides to be the moving direction of the moving body 3) of the vibrating body 80 (piezoelectric element 40b) and a line connecting the center portions of two lengthwise sides (long sides provided in the direction of contact of the vibrating body 80 and the moving body 3). Then, the electrode 25 is provided substantially over the entire top side of the piezoelectric element 40b. Electrodes 25, 26, 27, 28 of silver or the like are provided at the bottom surface of the vibrating body 80 in four areas separated by a line connecting the center portions of two widthwise sides (short sides to be the moving direction of the moving body 3) of the vibrating body 80 and a line connecting the center portions of two lengthwise sides (long sides provided in the direction of contact of the vibrating body 80 and the moving body 3).

Side electrodes 29, 30, 31, 32, 33 are provided at a side face of the piezoelectric element 40 (side electrodes 32, 33 are hidden and not seen in FIG. 12). The side electrode 29 short-circuits an end portion 24a of the electrode 24 and an end portion 28a of the electrode 28. The side electrode 31 short-circuits an end portion 25a of the electrode 25. The side electrode 30 short-circuits an end portion 22a of the electrode 22 and an end portion 26a of the electrode 26. The side electrode 32 short-circuits an end portion 21a of the electrode 21 and the end portion 25a of the electrode 25. The side electrode 33 short-circuits a bulging portion 23a of the electrode 23 and a bulging portion 27a of the electrode 27.

With the electrode 25 (side electrode 31) serving as the GND, a high voltage is applied to the electrodes 21, 22, 23, 24, 25, 26, 27, 28 (side electrodes 29, 30, 32, 33), so that the vibrating body 80 is polarized in directions of + and − in the diagrams. Of the electrodes, the electrodes 21, 22 and the electrodes 25, 26 constitute the first electrodes, and the electrodes 23, 24 and the electrodes 27, 28 constitute the second electrodes.

Next, a drive method for the ultrasonic motor 100 will be described. When the drive signal is applied between the side electrodes 30, 32 and the side electrode 31, the vibrating body 80 is excited to have the longitudinal vibration and bending vibration. The combined vibration of those two vibrations causes the moving body 3 to be frictionally driven. When the drive signal is applied between the side electrodes 29, 33 and the side electrode 31, the phase relationship between the longitudinal vibration and bending vibration caused on the vibrating body 80 is reversed. Therefore, the direction of the elliptical motion of the friction member 90 caused by the combining of the two vibrations is reversed, so that the moving direction of the moving body 3 is reversed.

Although the foregoing description has been given of the example where two piezoelectric elements 40a, 40b alone are laminated to constitute the vibrating body 80, further piezoelectric elements may be laminated.

Such laminated structure of the vibrating body 80 can reduce the polarization voltage and permit the use of the lamination process similar to that for a stacked capacitor, so that the fabrication process becomes simpler and a small-sized vibrating body 80 with a high quality can be realized at a low cost. Because the drive voltage can be reduced, the drive circuit can be simplified, ensuring size reduction of an electronic device having the ultrasonic motor of the present invention mounted therein. Since power which is wasted by a boosting circuit can be saved, the consumed power of the electronic device can be reduced.

Such lamination of piezoelectric elements can be adapted to a vibrating body 200 in a fifth embodiment to be described later as well as the vibrating bodies 60, 70 in the second and third embodiments.

Fifth Embodiment

A fifth embodiment of an ultrasonic motor of the present invention will be described below referring to FIGS. 14, 15A and 15B, 16 and 17A and 17B. The following description is centered on differences from the illustrated vibrating bodies 50, 60, 70 of the first to third embodiments, or the electrode structure and vibration mode of the vibrating body 200.

The vibrating body 200 comprises a rectangular piezoelectric element 210 and a friction member 90 provided at a center portion of one long side.

Figure 15A:
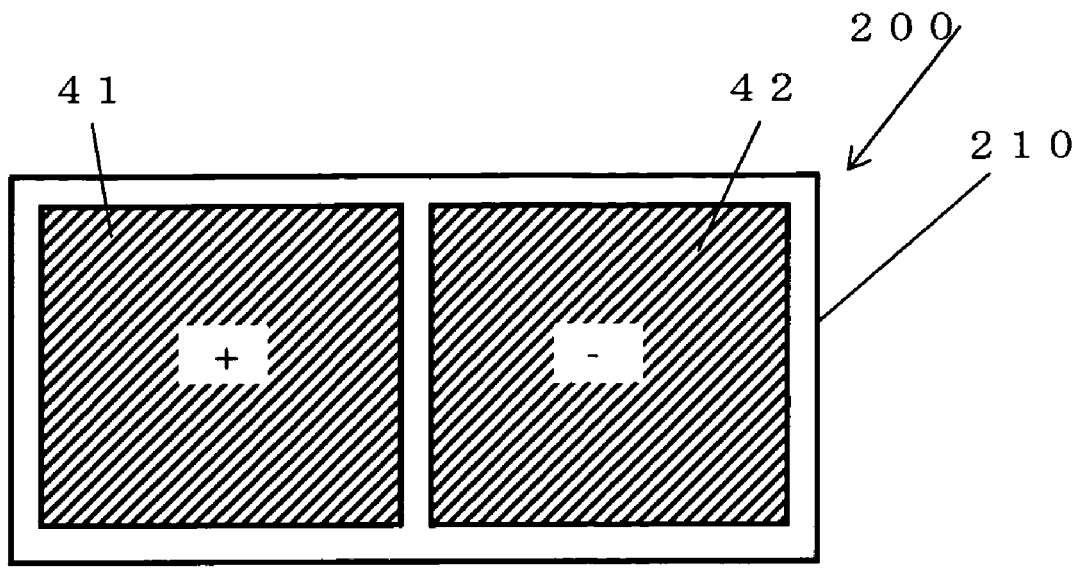
FIGS. 15A and 15B are diagrams showing the electrode structure of the vibrating body according to the fifth embodiment of the invention.
Figure 15B:
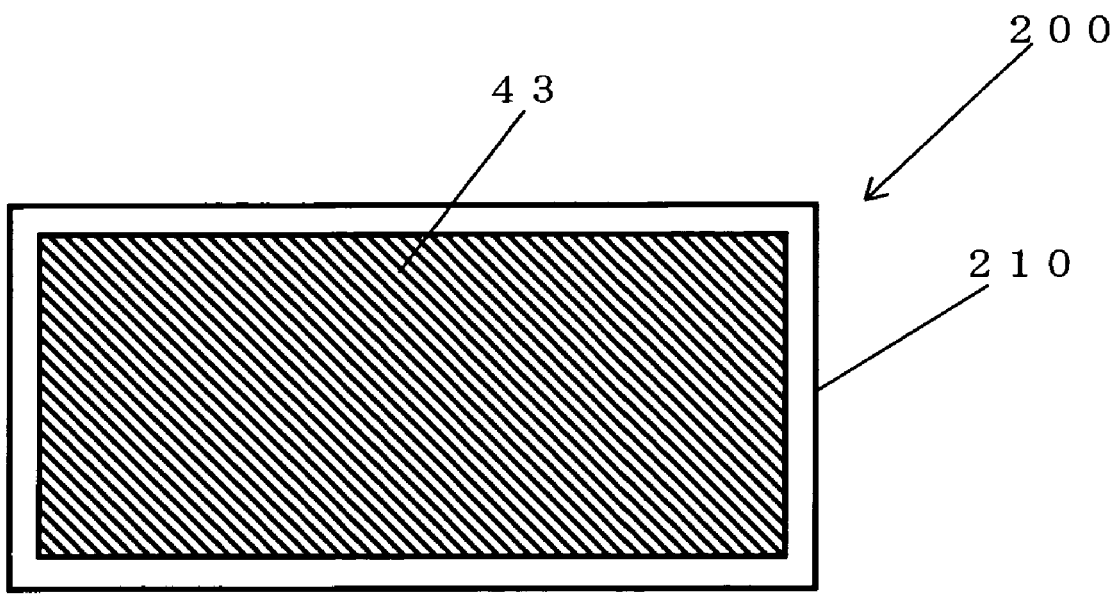

The electrode structure of the piezoelectric element 210 to be used in the vibrating body 200 will be described referring to FIGS. 15A and 15B (the friction member 90 not shown therein). A first electrode 41 and a second electrode 42 are provided at the top surface (one side) of the rectangular piezoelectric element 210 at two areas separated by a line connecting center portions of two long sides of the piezoelectric element 210. An electrode 43 is provided substantially over the entire bottom side (the other side) of the piezoelectric element 210. With the electrode 43 serving as the GND, a high voltage is applied to the electrodes 41, 42, so that the piezoelectric element 210 is polarized in directions of + and − in FIG. 15A.

Figure 16:
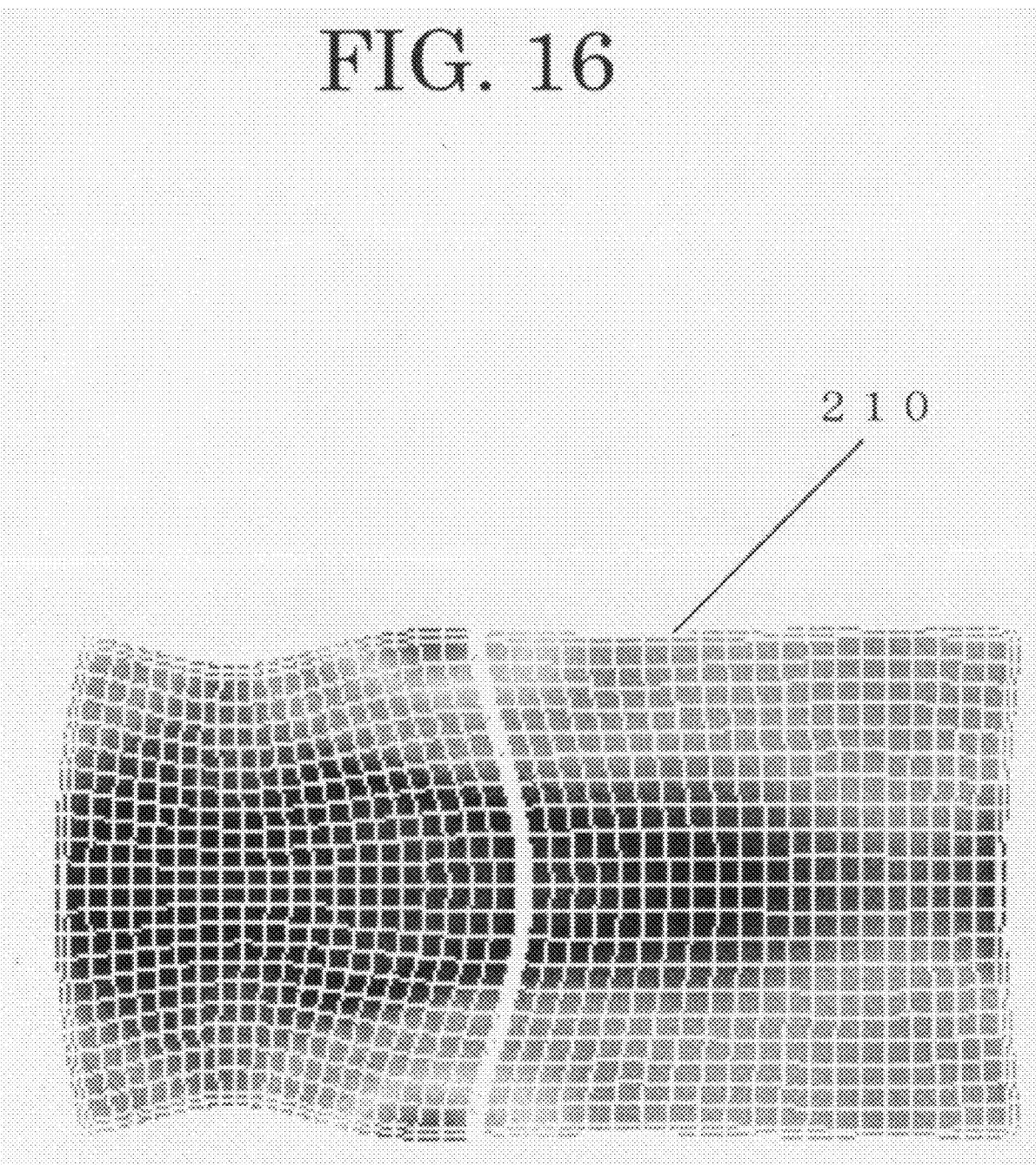
FIG. 16 is a diagram showing the vibration mode of the vibrating body according to the fifth embodiment of the invention.

Next, a drive method for the vibrating body 200 will be described. When the drive signal is applied between the electrode 43 to be the GND and the first electrode 41, the vibration mode as shown in FIG. 16 is provided (the friction member 90 not shown therein). At this time, the distal end of the friction member 90 is vibrated to have components in two directions (displacement along the long side of the vibrating body 200 and displacement along the short side thereof), the moving body 3 which is in contact with the distal end is driven. When the drive signal is applied between the electrode 43 to be the GND and the third electrode 42, on the other hand, the phase relationship between the vibrations in the two directions is reversed, so that the moving body 3 is driven in the opposite direction.

Figure 17A:
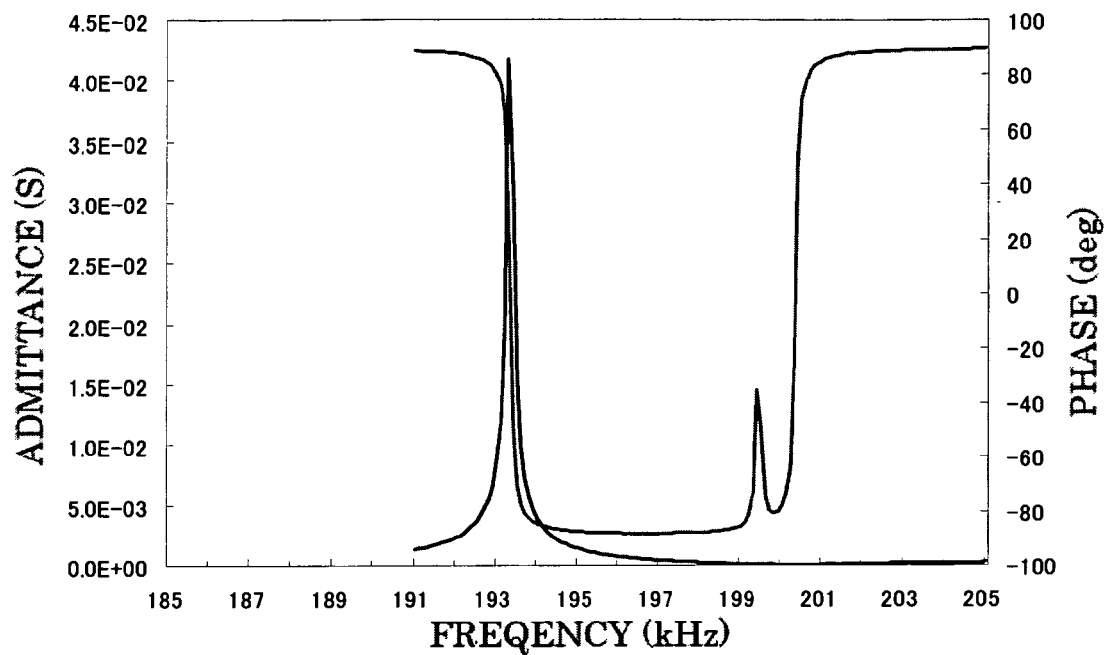
FIGS. 17A and 17B are diagrams showing the relationship between the frequency-admittance and phase of the vibrating body according to the fifth embodiment of the invention and those to be compared therewith.
Figure 17B:
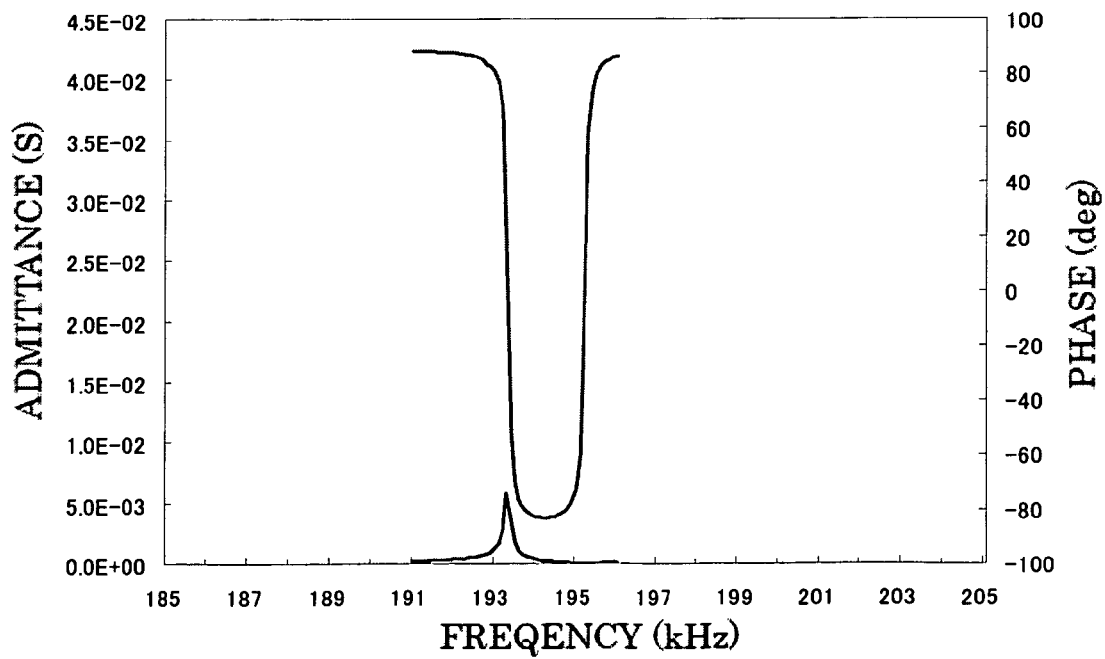

FIG. 17A shows the relationship between the frequency-admittance and phase when the drive signal is applied between the electrode 43 to be the GND and the first electrode 41 in the piezoelectric element 210. FIG. 17B shows the relationship between the frequency-admittance and phase when the drive signal is applied between the electrode 43 and the first electrode 41 in a case where the polarization direction of that portion of the piezoelectric element 210 where the second electrode 42 is provided is set the same as the polarization direction of that portion of the piezoelectric element 210 where the first electrode 41 is provided (both directions being + in FIG. 17B) as a comparative example.

Those are the examples where by using a finite element method (used software: Piezo Plus (produced by Dynus Co., Ltd.), analysts was conducted on a model with the piezoelectric element 210 having a long side of 20 mm, a short side of 10 mm and a thickness of 2.0 mm, the individual electrodes having a marginal width of 0.3 mm, and a gap of 0.3 mm between the electrodes and the side face.

According to the vibrating body 200 (piezoelectric element 210), as the polarization direction of the area where the first electrode 41 is provided is set different from the polarization direction of the area where the second electrode 42 is provided, the vibration of the vibrating body 200 is made greater, thus increasing the output of the moving body 3.

Although the electrode 43 to be the GND is provided over substantially the entire bottom side (the other side) of the piezoelectric element 210, the bottom side of the piezoelectric element 210 may be divided by a line connecting the center portions of two long sides of the piezoelectric element 210 in such a way that the electrode 43 faces the first electrode 41 and the second electrode 42. In this case, the electrode that faces that electrode to which the drive signal is applied (either the first electrode 41 or the second electrode 42) is used as the GND electrode.

The ultrasonic motor of the present invention can be used to drive a read head and write head in an information recording device, drive lenses in a digital camera, a video camera or the like, drive various drive sections (calendar, hands, etc.) in a wrist watch which demands a smaller and thinner in size and lower consumed power, in addition to a stage which needs precise positioning, and can be adapted as a drive source for various electronic devices.

What is claimed is:

1. An ultrasonic motor comprising:
   a vibrating body having a piezoelectric element;
   a moving body which contacts the vibrating body;
   a first electrode or first electrodes provided at one side of the piezoelectric element, whereby the moving body or the vibrating body itself is driven in a first direction by a vibration caused on the vibrating body by applying a drive signal between the first electrode or first electrodes and a GND electrode provided at an other side of the piezoelectric element; and
   a second electrode or second electrodes provided at the one side of the piezoelectric element, whereby the moving body or the vibrating body itself is driven in a second direction by a vibration caused on the vibrating body by applying a drive signal between the second electrode or second electrodes and the GND electrode provided at the other side of the piezoelectric element,
   wherein a polarization direction of a portion of the piezoelectric element where the first electrode or the first electrodes are provided differs from a polarization direction of a portion of the piezoelectric element where the second electrode or the second electrodes are provided.

2. The ultrasonic motor according to claim 1, wherein vibrations caused on the vibrating body are two vibrations different from each other.

3. The ultrasonic motor according to claim 1, wherein the vibrations are a longitudinal vibration and a bending vibration.

4. The ultrasonic motor according to claim 1, wherein the vibrating body has a rectangular portion having four areas separated by a line connecting center portions of two short sides of the rectangular portion and a line connecting center portions of two long sides of the rectangular portion, two electrodes provided at two orthogonal portions of the four areas constitute the first electrodes, and two electrodes provided at other two orthogonal portions of the four areas constitute the second electrodes.

5. The ultrasonic motor according to claim 1, wherein a third electrode is provided at the one side of the piezoelectric element, and a drive signal is always applied to the third electrode at a time of driving.

6. The ultrasonic motor according to claim 5, wherein the vibrating body has a rectangular portion having three areas separated by lines connecting points which separates two short sides of the rectangular portion into three portions, an electrode provided at a center portion of the three areas serves as the third electrode, two end portions of the three areas are separated into four areas by a line connecting center points of two long sides of the piezoelectric element, two electrodes provided at two orthogonal portions of the four areas constitute the first electrodes, and two electrodes provided at other two orthogonal portions of the four areas constitute the second electrodes.

7. The ultrasonic motor according to claim 6, wherein a polarization direction of the piezoelectric element at those portions where the first electrodes are provided is identical to a polarization direction of the piezoelectric element at those portions where the third electrodes are provided, and the moving body and the vibrating body are driven relative to each other by applying a drive signal between the first electrodes and third electrodes and the GND electrode.

8. The ultrasonic motor according to claim 5, wherein an electrode provided at one of two areas separated by a line connecting points which separates two short sides of the rectangular portion into two portions serves as the third electrode, and electrodes provided at two areas obtained by further separating an other one of the two areas by a line connecting center points of two long sides of the vibrating body respectively serve as the first electrode and the second electrode.

9. The ultrasonic motor according to claim 8, wherein a polarization direction of the piezoelectric element at that portion where the first electrode is provided is reverse to a polarization direction of the piezoelectric element at that portion where the third electrode is provided, and the moving body and the vibrating body are driven relative to each other by applying a drive signal between the first electrode and third electrode and the GND electrode.

10. The ultrasonic motor according to claim 1, wherein the vibrating body has a rectangular portion, and the first electrode and second electrode are respectively provided at two areas separated by a line connecting center portions of two long sides of the rectangular portion.

11. The ultrasonic motor according to claim 1, wherein the vibrating body comprises laminated piezoelectric elements.

12. An electronic device having an ultrasonic motor as recited in claim 1 mounted therein.

* * * * *